United States Patent
Sukemori

(10) Patent No.: US 11,431,305 B2
(45) Date of Patent: Aug. 30, 2022

(54) POWER AMPLIFIER MODULE AND POWER AMPLIFICATION METHOD

(71) Applicant: Murata Manufacturing Co., Ltd., Kyoto (JP)

(72) Inventor: Yoshiaki Sukemori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 6 days.

(21) Appl. No.: 17/081,168

(22) Filed: Oct. 27, 2020

(65) Prior Publication Data

US 2021/0126600 A1   Apr. 29, 2021

(30) Foreign Application Priority Data

Oct. 28, 2019   (JP) .............................. JP2019-195308

(51) Int. Cl.
   *H03F 1/30* (2006.01)
   *H03F 3/24* (2006.01)
   *H03F 3/195* (2006.01)
   *H03F 3/30* (2006.01)

(52) U.S. Cl.
   CPC ............. *H03F 3/245* (2013.01); *H03F 3/195* (2013.01); *H03F 3/303* (2013.01); *H03F 2200/451* (2013.01); *H03F 2200/504* (2013.01)

(58) Field of Classification Search
   CPC ........................................................ H03F 1/30
   USPC .................................................. 330/296, 285
   See application file for complete search history.

(56) References Cited

U.S. PATENT DOCUMENTS

| | | | |
|---|---|---|---|
| 6,750,721 B2 | 6/2004 | Patterson | |
| 6,784,743 B2 * | 8/2004 | Taniguchi | H03D 7/1433 327/491 |
| 7,365,604 B2 * | 4/2008 | Luo | H03F 1/30 330/285 |
| 9,660,589 B2 | 5/2017 | Kondo et al. | |
| 10,158,327 B2 * | 12/2018 | Kim | H03F 1/0266 |
| 10,171,036 B2 * | 1/2019 | Tanaka | H03F 3/21 |
| 10,291,187 B2 * | 5/2019 | Honda | H03F 3/21 |
| 2006/0145765 A1 | 7/2006 | Honda | |
| 2015/0349715 A1 | 12/2015 | Gerard et al. | |

(Continued)

FOREIGN PATENT DOCUMENTS

| | | |
|---|---|---|
| CN | 204156827 U | 2/2015 |
| JP | 2006-191358 A | 7/2006 |
| JP | 2016-192590 A | 11/2016 |

(Continued)

Primary Examiner — Henry Choe
(74) Attorney, Agent, or Firm — Pearne & Gordon LLP

(57) ABSTRACT

An amplifier transistor operates in two operation modes having different characteristics. A first bias circuit including a first bias supply transistor supplies an output current of the first bias supply transistor to the amplifier transistor as a bias current. A second bias circuit including a second bias supply transistor supplies a portion of an output current of the second bias supply transistor to the amplifier transistor as a bias current. At least one of the first bias circuit and the second bias circuit is selected and operates in accordance with an operation mode of the amplifier transistor by using a bias control signal input to a bias control terminal. The second bias circuit includes a current path along which a portion of the output current of the second bias supply transistor is returned to the second bias circuit.

20 Claims, 10 Drawing Sheets

(56) References Cited

U.S. PATENT DOCUMENTS

2016/0294328 A1    10/2016  Kondo et al.
2018/0316311 A1    11/2018  Gebeyehu et al.

FOREIGN PATENT DOCUMENTS

JP       2017-112555   A    6/2017
KR   10-2015-0136978   A   12/2015

* cited by examiner

POWER AMPLIFIER MODULE AND POWER AMPLIFICATION METHOD

CROSS REFERENCE TO RELATED APPLICATION

This application claims priority from Japanese Patent Application No. 2019-195308 filed on Oct. 28, 2019. The content of this application is incorporated herein by reference in its entirety.

BACKGROUND

The present disclosure relates to a power amplifier module and a power amplification method. A mobile communication device, such as a mobile terminal includes a power amplifier module to amplify the power of a signal to be transmitted to a base station. A mobile terminal and the like are required to reduce power consumption to increase the length of time during which communication is possible. To reduce power consumption, an envelope tracking (ET) scheme may be used for a power amplifier module in a mobile terminal and the like. Also, an average power tracking (APT) scheme may be used to enhance the linearity of the relationship (AM-AM) between the input amplitude and the output amplitude during a low-power operation. Accordingly, a single amplifier circuit may have a mode of operation in accordance with the ET scheme and a mode of operation in accordance with the APT scheme.

Japanese Unexamined Patent Application Publication No. 2016-192590 discloses a power amplifier module having a mode of operation in accordance with the ET scheme and a mode of operation in accordance with the APT scheme. In the power amplifier module, a bias circuit supplies a bias current to the base of an amplifier transistor from a bias power supply via a base ballast resistor. The bias circuit has a function of making the resistance value of the base ballast resistor different depending on the operation mode of the power amplifier module.

A power amplifier module configured to operate in accordance with the APT scheme may have two operation modes, namely, a low output mode and a high output mode. For example, the operation mode of the power amplifier module is switched between the low output mode and the high output mode in accordance with the output signal level. In the low output mode and the high output mode, the base ballast resistor of the bias circuit has different resistance values.

As described above, in the existing power amplifier module having a function of switching between two operation modes and operating in one of the two operation modes, the resistance value of the base ballast resistor of the bias circuit is switched in accordance with the operation mode of the power amplifier module.

BRIEF SUMMARY

If the requirements for the characteristics of the power amplifier module are stringent in each of the two operation modes, it is difficult to meet the requirements merely by switching the resistance value of the base ballast resistor of the bias circuit. Accordingly, the present disclosure provides a power amplifier module having a function of operating in at least two operation modes, in which the characteristics of the power amplifier module for each of the two operation modes can be exploited. The present disclosure further provides a power amplification method using the power amplifier module.

According to embodiments of the present disclosure, a power amplifier module includes an amplifier transistor that amplifies an input signal and outputs the amplified signal and that operates in at least two operation modes having different characteristics, a first bias circuit that includes a first bias supply transistor and that supplies an output current of the first bias supply transistor to the amplifier transistor as a bias current, a second bias circuit that includes a second bias supply transistor and that supplies a portion of an output current of the second bias supply transistor to the amplifier transistor as a bias current, and a bias control terminal that receives a bias control signal for selecting and operating at least one of the first bias circuit and the second bias circuit in accordance with an operation mode of the amplifier transistor. The second bias circuit includes a current path along which a portion of the output current of the second bias supply transistor is returned to the second bias circuit.

According to embodiments of the present disclosure, a power amplification method is a method for operating a power amplifier module to perform power amplification. The power amplifier module includes an amplifier transistor that amplifies an input signal and outputs the amplified signal, a first bias circuit that includes a first bias supply transistor and that supplies an output current of the first bias supply transistor to the amplifier transistor as a bias current, and a second bias circuit that includes a second bias supply transistor and that supplies a portion of an output current of the second bias supply transistor to the amplifier transistor as a bias current, the second bias circuit including a current path along which a portion of the output current of the second bias supply transistor is returned to the second bias circuit. The power amplification method includes supplying a bias current from the first bias circuit to the amplifier transistor when the amplifier transistor is caused to operate in accordance with an envelope tracking scheme; and supplying a bias current from the second bias circuit to the amplifier transistor when the amplifier transistor is caused to operate in accordance with an average power tracking scheme.

According to embodiments of the present disclosure, a power amplification method is a method for operating a power amplifier module to perform power amplification. The power amplifier module includes an amplifier transistor that amplifies an input signal and outputs the amplified signal, a first bias circuit that includes a first bias supply transistor and that supplies an output current of the first bias supply transistor to the amplifier transistor as a bias current, and a second bias circuit that includes a second bias supply transistor and that supplies a portion of an output current of the second bias supply transistor to the amplifier transistor as a bias current, the second bias circuit including a current path along which a portion of the output current of the second bias supply transistor is returned to the second bias circuit. The power amplification method includes switching between a state of supplying a bias current from the first bias circuit to the amplifier transistor and a state of supplying a bias current from both the first bias circuit and the second bias circuit to the amplifier transistor in accordance with a signal level output from the amplifier transistor.

Since a portion of the output current of the second bias supply transistor is returned to the second bias circuit along the current path, the second bias circuit can perform feedback control by using the returned current. At least one of the first bias circuit and the second bias circuit capable of performing feedback control is selected and operates in accordance with the operation mode of the amplifier transistor, and thus the characteristics of each operation mode can be utilized as desired.

Other features, elements, characteristics and advantages of the present disclosure will become more apparent from the following detailed description of embodiments of the present disclosure with reference to the attached drawings.

DETAILED DESCRIPTION

First Exemplary Embodiment

A power amplifier module according to a first exemplary embodiment will be described with reference to FIGS. 1 to 3 and 4A and 4B.

Figure 1:
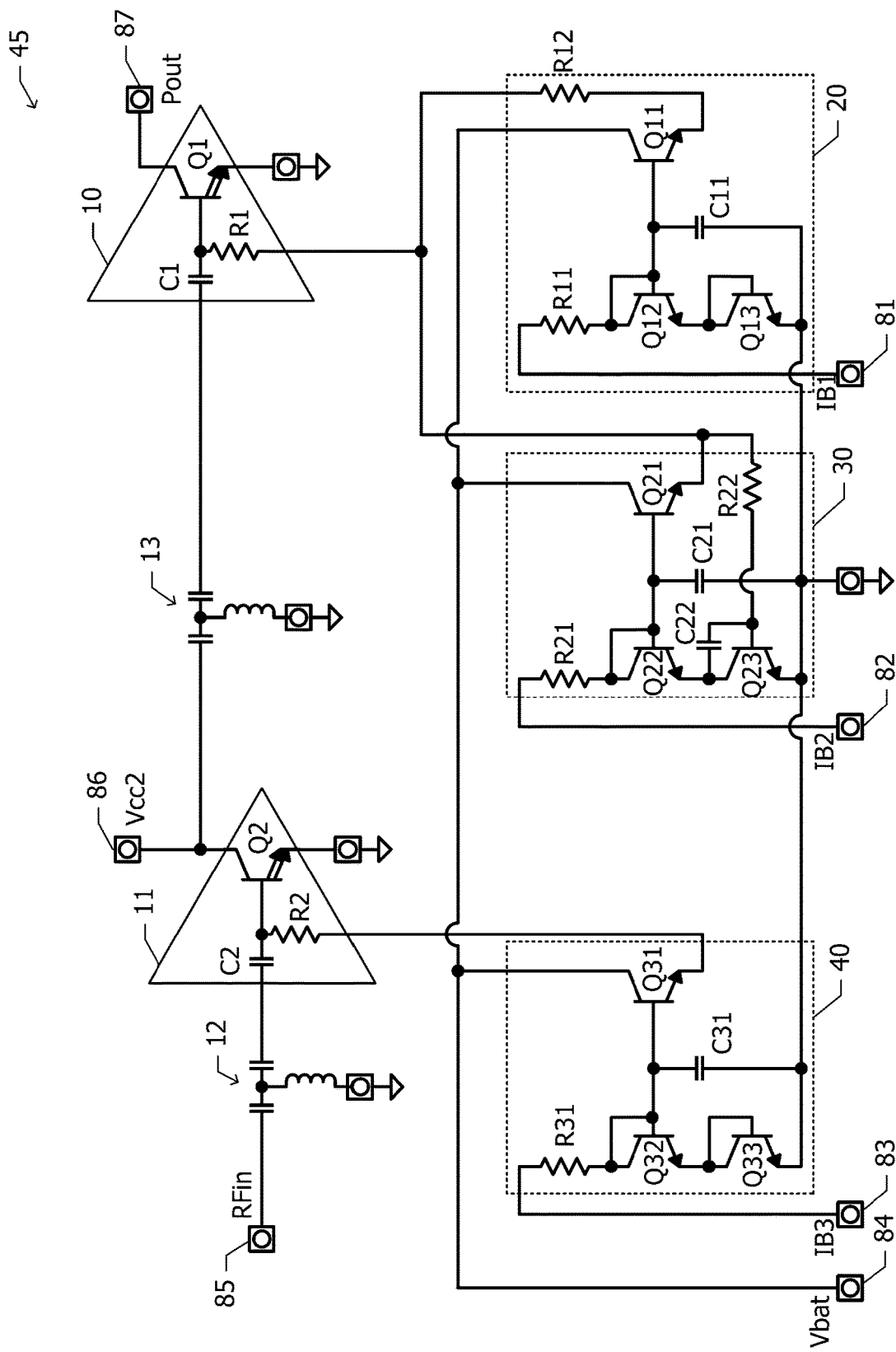
FIG. 1 is an equivalent circuit diagram of an amplifier circuit element in a power amplifier module according to a first exemplary embodiment.

FIG. 1 is an equivalent circuit diagram of an amplifier circuit element 45 in the power amplifier module according to the first exemplary embodiment. The amplifier circuit element 45 includes a power-stage amplifier circuit 10, a driver-stage amplifier circuit 11, a first bias circuit 20 and a second bias circuit 30 for the power stage, and a driver-stage bias circuit 40 for the driver stage. The amplifier circuit element 45 further includes an input-side impedance matching circuit 12, an inter-stage impedance matching circuit 13, a plurality of external terminals 81, 82, 83, 84, 85, 86, and 87, and a plurality of external terminals for ground. The plurality of external terminals 81, 82, 83, 84, 85, 86, and 87, and the plurality of external terminals for ground are each implemented as a Cu pillar bump, for example. The plurality of components described above are formed on a single semiconductor chip, for example. In FIG. 1, the external terminals for ground are not given reference numerals.

A radio-frequency (RF) input signal RFin is input from the external terminal 85. The RF input signal RFin is input to the driver-stage amplifier circuit 11 via the input-side impedance matching circuit 12. A signal amplified by the driver-stage amplifier circuit 11 is input to the power-stage amplifier circuit 10 via the inter-stage impedance matching circuit 13. A signal Pout amplified by the power-stage amplifier circuit 10 is output from the external terminal 87.

The power-stage amplifier circuit 10 includes an amplifier transistor Q1, a direct current (DC) cut capacitor C1, and a base ballast resistor R1. The amplifier transistor Q1 is constituted by a plurality of transistor cells connected in parallel with each other. The DC cut capacitor C1 and the base ballast resistor R1 are disposed for each of the transistor cells. The emitter of the amplifier transistor Q1 is grounded. The collector of the amplifier transistor Q1 is connected to the external terminal 87. Each of the plurality of transistor cells is configured as a heterojunction bipolar transistor (HBT), for example.

The DC cut capacitor C1 is connected to the base of the amplifier transistor Q1, and an RF signal amplified by the driver-stage amplifier circuit 11 is input to the base of the amplifier transistor Q1 via the DC cut capacitor C1. A base bias current is supplied to the base of the amplifier transistor Q1 from the first bias circuit 20 and the second bias circuit 30 via the base ballast resistor R1. A power supply voltage is supplied to the collector of the amplifier transistor Q1 from the external terminal 87.

The driver-stage amplifier circuit 11 includes an amplifier transistor Q2, a DC cut capacitor C2, and a base ballast resistor R2. The driver-stage amplifier circuit 11 has a configuration similar to that of the power-stage amplifier circuit 10. A power supply voltage Vcc2 is supplied to the collector of the amplifier transistor Q2 from the external terminal 86.

The first bias circuit 20 and the second bias circuit 30 supply a bias current to the base of the amplifier transistor Q1 via the base ballast resistor R1. The driver-stage bias circuit 40 supplies a bias current to the base of the amplifier transistor Q2 via the base ballast resistor R2.

Next, the circuit configuration of the first bias circuit 20 will be described. The first bias circuit 20 includes a first bias supply transistor Q11 and transistors Q12 and Q13. The first bias supply transistor Q11 and the transistors Q12 and Q13 are each a heterojunction bipolar transistor, by way of example.

The collector of the first bias supply transistor Q11 is connected to the external terminal 84. A bias power supply voltage Vbat is applied to the external terminal 84, and thus the bias power supply voltage Vbat is applied to the collector of the first bias supply transistor Q11. The emitter of the first bias supply transistor Q11 is connected to the base ballast resistor R1 via an output resistor R12. The output resistor R12 may be removed. The first bias supply transistor Q11 constitutes an emitter-follower circuit, and all of the emitter current is supplied to the amplifier transistor Q1 as a bias current. A circuit that supplies all of the emitter current to the amplifier transistor Q1 as a bias current, such as the first bias circuit 20, is referred to herein as "emitter-follower-type bias circuit".

The base and collector of each of the transistors Q12 and Q13 are short-circuited. A connection of a transistor whose base and collector are short-circuited is referred to as diode connection, and each of the transistors Q12 and Q13 operates as a diode.

A resistor R11 and the transistors Q12 and Q13 are connected in series in this order between the external terminal 81 and ground. A forward voltage is applied to the diodes constituted by the transistors Q12 and Q13. The external terminal 81 is connected to a variable current source. The variable current source generates, for example, a bias control signal IB1 for the amount of current corresponding to the output power of the power-stage amplifier circuit 10 and outputs the bias control signal IB1. Since the transistors Q12 and Q13 operate as diodes, a voltage of a predetermined level (for example, about 2.6 V) is generated between the collector and base of the transistor Q12.

The base of the first bias supply transistor Q11 and the base of the transistor Q12 are connected to each other. The base of the first bias supply transistor Q11 and the base of the transistor Q12 are grounded via a bypass capacitor C11.

Next, the operation of the first bias circuit 20 will be described.

When the bias control signal IB1 is supplied from the variable current source connected to the external terminal 81, a voltage corresponding to the amount of voltage drop generated across a series circuit of the transistors Q12 and Q13 is applied to the base of the first bias supply transistor Q11. An emitter current (output current) flows through the first bias supply transistor Q11 in accordance with the voltage applied to the base of the first bias supply transistor Q11. The emitter current is supplied to the base of the amplifier transistor Q1 via the output resistor R12 and the base ballast resistor R1 as a bias current.

When the bias control signal IB1 is not supplied to the external terminal 81, the first bias supply transistor Q11 is turned off. Accordingly, no bias current is supplied to the base of the amplifier transistor Q1 from the first bias circuit 20.

Next, the circuit configuration of the second bias circuit 30 will be described. The second bias circuit 30 includes a second bias supply transistor Q21 and transistors Q22 and Q23. The second bias supply transistor Q21 and the transistors Q22 and Q23 are each a heterojunction bipolar transistor, by way of example.

The collector of the second bias supply transistor Q21 is connected to the external terminal 84, and the bias power supply voltage Vbat is applied to the collector of the second bias supply transistor Q21. The emitter of the second bias supply transistor Q21 is connected to the base ballast resistor R1 and is also connected to the base of the transistor Q23 via a resistor R22. The resistor R22 functions as a current path along which a portion of the emitter current of the second bias supply transistor Q21 is returned to the second bias circuit 30. A circuit including a current path along which a portion of the emitter current of the second bias supply transistor Q21 is returned to the second bias circuit 30, such as the second bias circuit 30, is referred to herein as "feedback-type bias circuit".

The transistor Q22 is diode-connected and operates as a diode. The base and collector of the transistor Q23 are connected to each other via a capacitor C22. A resistor R21 and the transistors Q22 and Q23 are connected in series in this order between the external terminal 82 and ground. Each of the transistors Q22 and Q23 is connected in such a manner that the emitter thereof is close to ground.

The external terminal 82 is connected to a variable current source, and a bias control signal IB2, which is a constant current, is supplied from the external terminal 82 to the resistor R21. The base of the second bias supply transistor Q21 and the base of the transistor Q22 are connected to each other. The base of the second bias supply transistor Q21 and the base of the transistor Q22 are grounded via a bypass capacitor C21.

Next, the operation of the second bias circuit 30 will be described.

When the bias control signal IB2 is supplied from the variable current source connected to the external terminal 82, a voltage corresponding to the amount of voltage drop generated across the series circuit of the transistors Q22 and Q23 is applied to the base of the second bias supply transistor Q21. An emitter current (output current) flows through the second bias supply transistor Q21 in accordance with the voltage applied to the base of the second bias supply transistor Q21. A portion of the emitter current is supplied to the base of the amplifier transistor Q1 via the base ballast resistor R1 as a bias current.

When the output power of the amplifier transistor Q1 increases, the bias current supplied from the emitter of the second bias supply transistor Q21 to the base of the amplifier transistor Q1 increases, resulting in an increase in the emitter voltage of the second bias supply transistor Q21. At this time, the base voltage of the transistor Q23 also increases through the resistor R22. Accordingly, the amount of current flowing through the transistor Q23 increases, and the collector voltage of the transistor Q22 decreases. In response to the decrease in the collector voltage of the transistor Q22, the base voltage of the second bias supply transistor Q21 decreases, and the amount of current flowing through the second bias supply transistor Q21 decreases.

Accordingly, in the second bias circuit 30, when the output power of the amplifier transistor Q1 increases and the emitter current of the second bias supply transistor Q21 increases, negative feedback control to decrease the emitter current of the second bias supply transistor Q21 is performed through the resistor R22. As a result, the emitter current of the second bias supply transistor Q21 is stabilized.

When the bias control signal IB2 is not supplied to the external terminal 82, the second bias supply transistor Q21 is turned off. Thus, no bias current is supplied to the base of the amplifier transistor Q1 from the second bias circuit 30.

The capacitor C22 connects an RF signal flowing from the power-stage amplifier circuit 10 to ground for alternating current (AC) via the transistor Q23. Thus, the base current of the transistor Q23 is less affected by the RF signal.

Next, the circuit configuration of the driver-stage bias circuit 40 will be described. The driver-stage bias circuit 40 includes a bias supply transistor Q31, a resistor R31, transistors Q32 and Q33, and a bypass capacitor C31. The basic circuit configuration of the driver-stage bias circuit 40 is substantially the same as the circuit configuration of the first bias circuit 20.

A bias control signal IB3 is supplied to the resistor R31 from a variable current source connected to the external terminal 83. The emitter current of the bias supply transistor Q31 is supplied to the base of the amplifier transistor Q2 of the driver-stage amplifier circuit 11 as a bias current.

Figure 2:
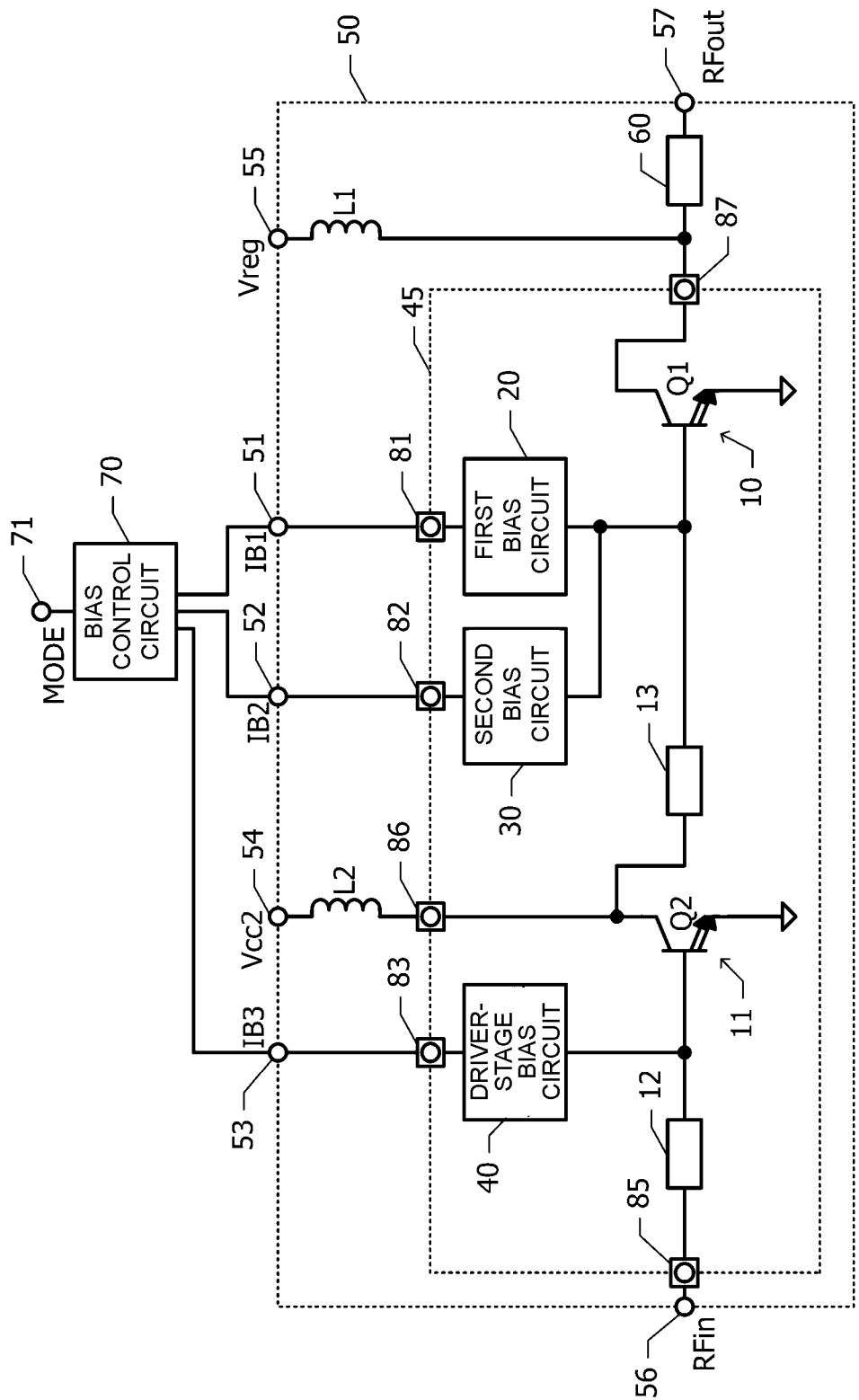
FIG. 2 is a block diagram of the power amplifier module according to the first exemplary embodiment.

FIG. 2 is a block diagram of a power amplifier module 50 according to the first exemplary embodiment. The power amplifier module 50 according to the first exemplary embodiment includes the amplifier circuit element 45 (FIG.

1), an output-side impedance matching circuit 60, and inductors L1 and L2. In FIG. 2, some of the components of the amplifier circuit element 45 are not illustrated. The amplifier circuit element 45, the output-side impedance matching circuit 60, the inductors L1 and L2, and so on are mounted on a common module substrate. The power amplifier module 50 includes bias control terminals 51, 52, and 53, a driver-stage power supply terminal 54, a power-stage power supply terminal 55, a signal input terminal 56, and a signal output terminal 57. The bias control terminals 51, 52, and 53, the driver-stage power supply terminal 54, the power-stage power supply terminal 55, the signal input terminal 56, and the signal output terminal 57 are mounted on the module substrate.

The external terminal 85 of the amplifier circuit element 45 is connected to the signal input terminal 56. The RF input signal RFin is input to the amplifier circuit element 45 from the signal input terminal 56. The bias control terminal 53 is connected to the external terminal 83 of the amplifier circuit element 45. The bias control signal IB3 is supplied from the bias control terminal 53 to the driver-stage bias circuit 40 of the amplifier circuit element 45. The external terminal 86 of the amplifier circuit element 45 is connected to the driver-stage power supply terminal 54 via the inductor L2. The power supply voltage Vcc2 is supplied to the collector of the amplifier transistor Q2 of the driver-stage amplifier circuit 11 via the inductor L2.

The external terminals 81, 82, and 83 of the amplifier circuit element 45 are connected to the bias control terminals 51, 52, and 53, respectively. The bias control terminals 51, 52, and 53 are connected to an external bias control circuit 70. The bias control circuit 70 includes an operation mode notification terminal 71. The bias control circuit 70 selects at least one of the bias control terminals 51 and 52 in accordance with an operation mode notification signal MODE provided to the operation mode notification terminal 71. The bias control circuit 70 supplies the bias control signal IB1 to the first bias circuit 20 in response to the selection of the bias control terminal 51, and supplies the bias control signal IB2 to the second bias circuit 30 in response to the selection of the bias control terminal 52. Further, the bias control circuit 70 supplies the bias control signal IB3 to the driver-stage bias circuit 40 via the bias control terminal 53 and the external terminal 83.

The external terminal 87 of the amplifier circuit element 45 is connected to the power-stage power supply terminal 55 via the inductor L1. A power supply voltage Vreg is supplied to the collector of the amplifier transistor Q1 of the power-stage amplifier circuit 10 via the inductor L1. The external terminal 87 is further connected to the signal output terminal 57 via the output-side impedance matching circuit 60. An RF signal amplified by the power-stage amplifier circuit 10 is output from the signal output terminal 57 as an RF output signal RFout.

Figure 3:
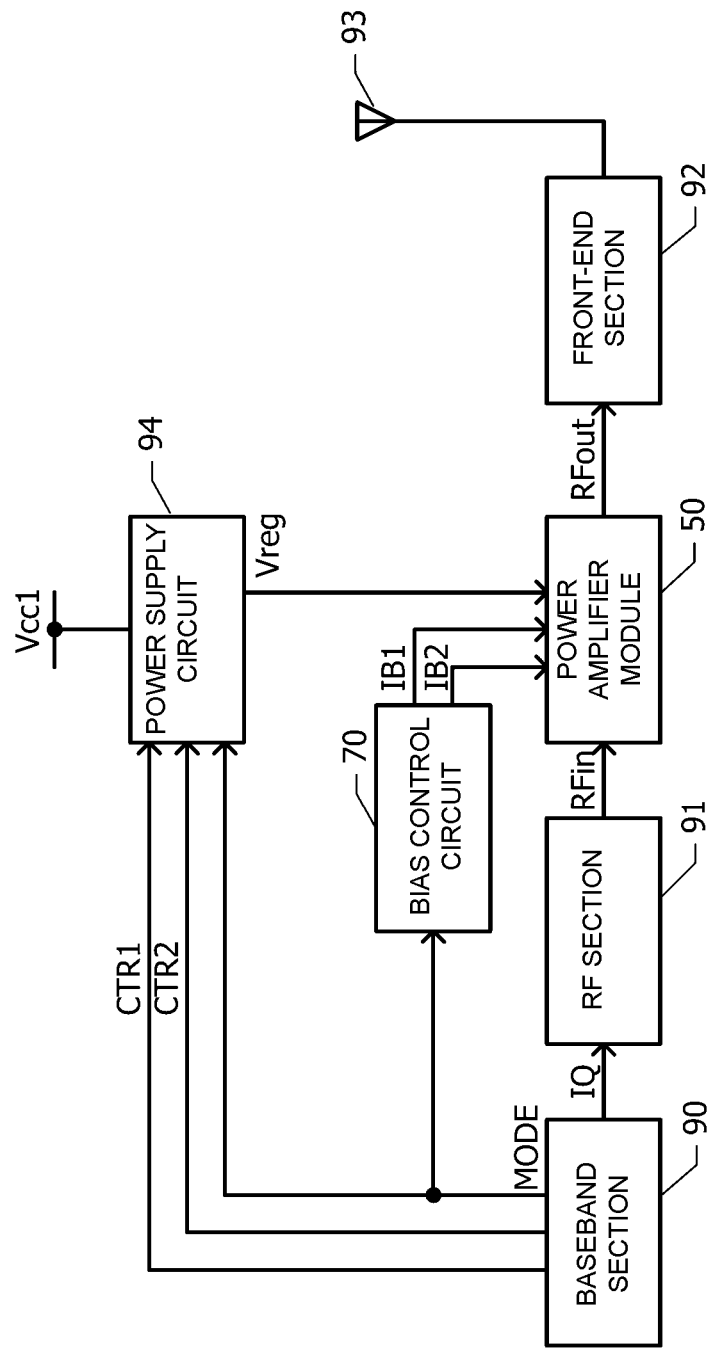
FIG. 3 is a block diagram of a transmission module including the power amplifier module according to the first exemplary embodiment.

FIG. 3 is a block diagram of a transmission module including the power amplifier module 50 according to the first exemplary embodiment. The transmission module includes a baseband section 90, an RF section 91, the power amplifier module 50, a front-end section 92, an antenna 93, the bias control circuit 70, and a power supply circuit 94.

The baseband section 90 modulates an input signal, such as an audio signal or a data signal, in accordance with a predetermined modulation scheme and outputs the modulated signal. For example, the baseband section 90 performs orthogonal modulation of an input signal and outputs an IQ signal (in-phase (I) signal and quadrature (Q) signal) as a modulated signal. Further, the baseband section 90 outputs the operation mode notification signal MODE specifying the operation mode of the power amplifier module 50 to the bias control circuit 70 and the power supply circuit 94.

For example, the operation mode notification signal MODE indicates either a first operation mode or a second operation mode. The first operation mode is a mode for operating the power-stage amplifier circuit 10 (FIGS. 1 and 2) of the power amplifier module 50 in accordance with an envelope tracking (ET) scheme, and the second operation mode is a mode for operating the power-stage amplifier circuit 10 (FIGS. 1 and 2) of the power amplifier module 50 in accordance with an average power tracking (APT) scheme. For example, when the output level of the power-stage amplifier circuit 10 (FIGS. 1 and 2) of the power amplifier module 50 is greater than or equal to a predetermined level, the baseband section 90 notifies the bias control circuit 70 and the power supply circuit 94 of the first operation mode corresponding to the ET scheme. When the output level of the power amplifier module 50 is less than the predetermined level, the baseband section 90 notifies the bias control circuit 70 and the power supply circuit 94 of the second operation mode corresponding to the APT scheme.

The RF section 91 generates, from the IQ signal input from the baseband section 90, the RF input signal RFin for performing wireless transmission and outputs the RF input signal RFin to the power amplifier module 50. The power amplifier module 50 amplifies the RF input signal RFin in accordance with the operation mode and outputs the RF output signal RFout to the front-end section 92. In the operation in the first operation mode corresponding to the ET scheme, the power-stage amplifier circuit 10 (FIGS. 1 and 2) is supplied with a bias current from the emitter-follower-type first bias circuit 20. In the operation in the second operation mode corresponding to the APT scheme, the power-stage amplifier circuit 10 (FIGS. 1 and 2) is supplied with a bias current from the feedback-type second bias circuit 30.

The power supply circuit 94 supplies one of a first power supply voltage for the ET scheme and a second power supply voltage for the APT scheme to the power amplifier module 50 as the power supply voltage Vreg in accordance with the operation mode notification signal MODE. The power supply circuit 94 is supplied with a power supply voltage Vcc1.

Voltage control signals CTRL and CTR2 for controlling the power supply voltage Vreg are supplied from the baseband section 90 to the power supply circuit 94. When the power amplifier module 50 is caused to operate in the first operation mode corresponding to the ET scheme, the baseband section 90 detects the amplitude level of the modulated signal and outputs the voltage control signal CTR1 corresponding to the change in the amplitude level of the modulated signal to the power supply circuit 94. When the power amplifier module 50 is caused to operate in the second operation mode corresponding to the APT scheme, the baseband section 90 detects the average power of the modulated signal and outputs the voltage control signal CTR2 corresponding to the average power of the modulated signal to the power supply circuit 94.

In response to being notified of the first operation mode corresponding to the ET scheme by using the operation mode notification signal MODE, the power supply circuit 94 changes the power supply voltage Vreg with a change in the amplitude level of the modulated signal in accordance with the voltage control signal CTR1. In response to being notified of the second operation mode corresponding to the APT scheme by using the operation mode notification signal MODE, the power supply circuit 94 changes the power supply voltage Vreg with a change in the average power of the modulated signal in accordance with the voltage control signal CTR2.

In response to being notified of the first operation mode corresponding to the ET scheme by using the operation mode notification signal MODE, the bias control circuit 70 supplies the bias control signal IB1 to the first bias circuit 20 (FIGS. 1 and 2) and does not supply the bias control signal IB2 to the second bias circuit 30 (FIGS. 1 and 2). In response to being notified of the second operation mode corresponding to the APT scheme by using the operation mode notification signal MODE, the bias control circuit 70 supplies the bias control signal IB2 to the second bias circuit 30 (FIGS. 1 and 2) and does not supply the bias control signal IB1 to the first bias circuit 20 (FIGS. 1 and 2).

The front-end section 92 performs a filtering process on the input RF output signal RFout. An RF signal output from the front-end section 92 is transmitted from the antenna 93. Further, the front-end section 92 switches between an RF reception signal received by the antenna 93 and an RF signal to be transmitted to perform transmission or reception.

Next, advantages of the first exemplary embodiment will be described with reference to FIGS. 4A and 4B.

Figure 4A:
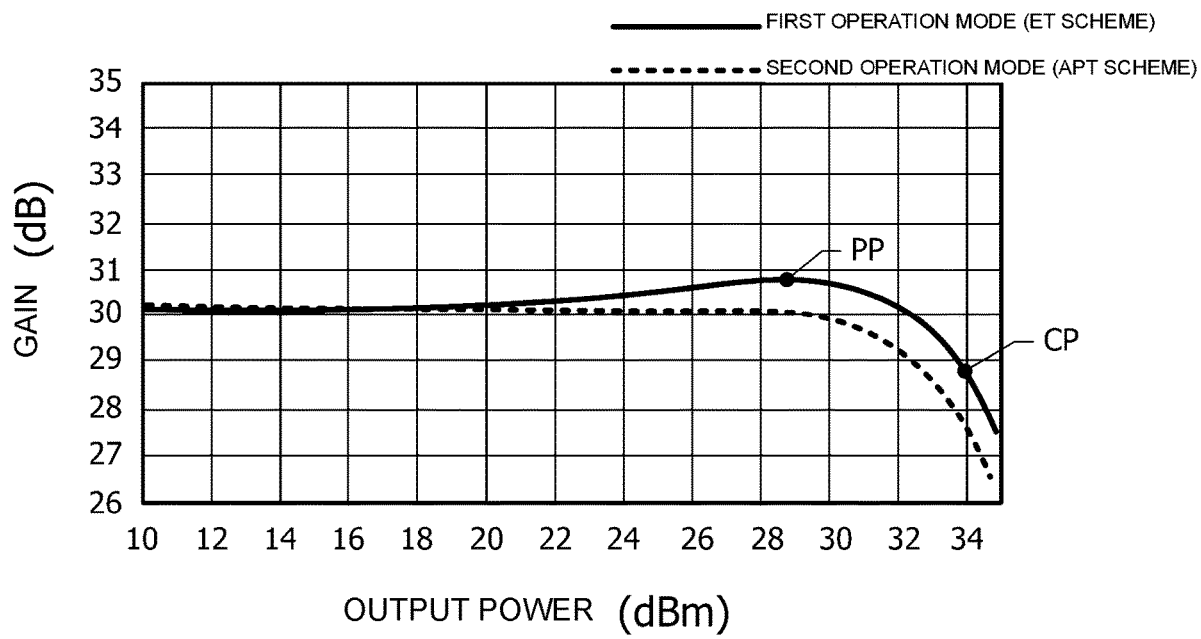
FIG. 4A is a graph illustrating an example of the relationship between the gain and output power of a power-stage amplifier circuit (FIGS. 1 and 2)
Figure 4B:
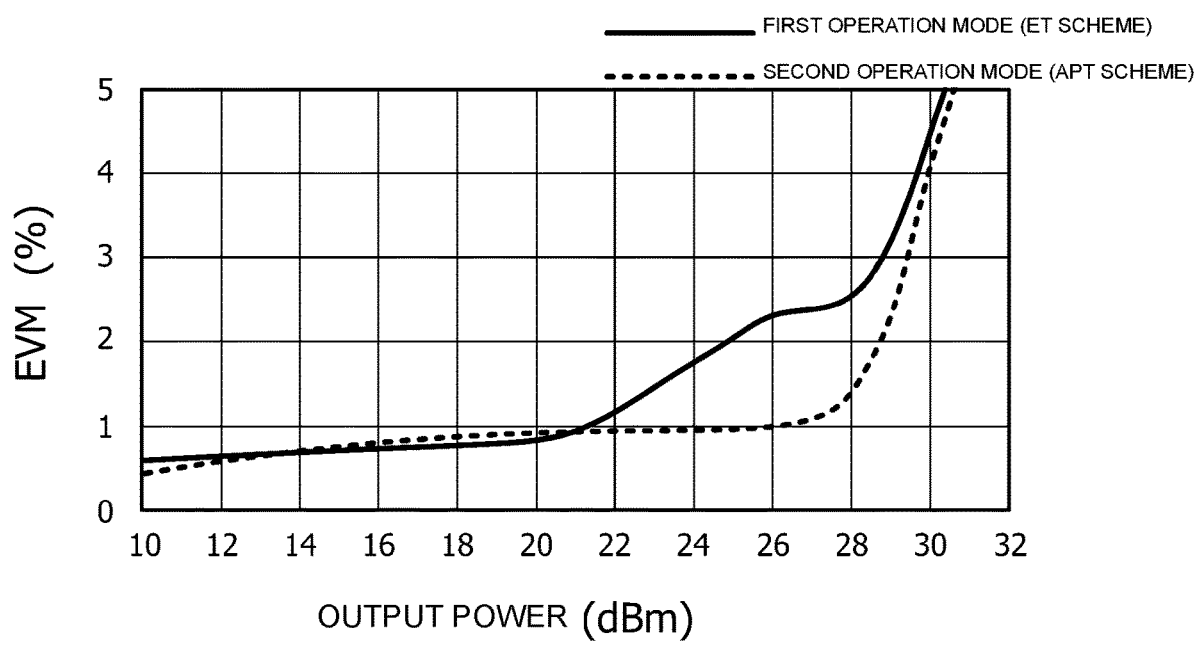
FIG. 4B is a graph illustrating an example of the relationship between the modulation accuracy (error vector magnitude (EVM)) and output power of the power-stage amplifier circuit (FIGS. 1 and 2)

FIG. 4A is a graph illustrating an example of the relationship between the gain and output power of the power-stage amplifier circuit 10 (FIGS. 1 and 2). The horizontal axis represents output power in "dBm", and the vertical axis represents gain in "dB". FIG. 4B is a graph illustrating an example of the relationship between the modulation accuracy (error vector magnitude (EVM)) and output power of the power-stage amplifier circuit 10 (FIGS. 1 and 2). The horizontal axis represents output power in "dBm", and the vertical axis represents EVM in "%". In the graphs illustrated in FIGS. 4A and 4B, the solid line indicates characteristics in the first operation mode corresponding to the ET scheme, and the broken line indicates characteristics in the second operation mode corresponding to the APT scheme.

The bias current from the first bias circuit 20 (FIGS. 1 and 2) is set so that gain expansion is achieved in a high output power region when the power-stage amplifier circuit 10 (FIGS. 1 and 2) operates in the first operation mode corresponding to the ET scheme. In the region where gain expansion is achieved, the gain shows a peak value at a peak point PP. It is desirable that the basic design of an amplifier circuit be performed using, as a compression point CP, a point at which the gain is decreased by a predetermined value, for example, about 2 dB, relative to the gain at the peak point PP. In this way, gain expansion is achieved by using the emitter-follower-type first bias circuit 20 (FIGS. 1 and 2), thereby making it easy to determine the gain at the peak point PP. As a result, advantageously, the compression point CP is stabilized.

The gain expansion causes a decrease in the linearity of the relationship (AM-AM) between the amplitude of the input signal and the amplitude of the output signal. Consequently, as illustrated in FIG. 4B, the EVM deteriorates in a high output power region. When the power-stage amplifier circuit 10 is caused to operate in the first operation mode corresponding to the ET scheme, it is desirable to perform digital predistortion (DPD) to compensate for the decrease in the linearity of AM-AM. DPD can suppress a decrease in the linearity of AM-AM in the overall amplifier circuit from the baseband section 90 (FIG. 3) to the signal output terminal 57 of the power amplifier module 50 (FIG. 2).

When the power-stage amplifier circuit 10 is caused to operate in the second operation mode corresponding to the APT scheme, gain expansion using an emitter-follower-type bias circuit causes a decrease in the linearity of AM-AM, resulting in deterioration of the EVM. In general, DPD is not performed in the operation of an amplifier circuit in accordance with the APT scheme. Thus, the deterioration of the EVM caused by the gain expansion is noticeable.

In the first exemplary embodiment, when the power-stage amplifier circuit 10 is caused to operate in the second operation mode corresponding to the APT scheme, the feedback-type second bias circuit 30 (FIGS. 1 and 2) is used. The increase in the emitter current of the second bias supply transistor Q21, which is caused by the self-bias when the output power is increased, is suppressed by the negative feedback control of the second bias circuit 30. Accordingly, as illustrated in FIG. 4A, gain expansion is less likely to occur. Consequently, as illustrated in FIG. 4B, the deterioration of the EVM can be suppressed. Since the deterioration of the EVM is suppressed, it is possible to achieve a power amplifier module that meets stringent EVM requirements for the fifth-generation mobile communication system.

Next, a modification of the first exemplary embodiment will be described with reference to FIG. 5. The first bias circuit 20 in the power amplifier module 50 according to the first exemplary embodiment, which is used for ET, is not limited to the circuit configuration illustrated in FIG. 1. In the following modification, the circuit configuration of the first bias circuit 20 is different from the circuit configuration of the first bias circuit 20 of the power amplifier module 50 according to the first exemplary embodiment. The first bias circuit 20 may be a bias circuit designed such that all of the emitter current output from the first bias supply transistor Q11 is supplied to the power-stage amplifier circuit 10 as a bias current to achieve gain expansion.

Figure 5:
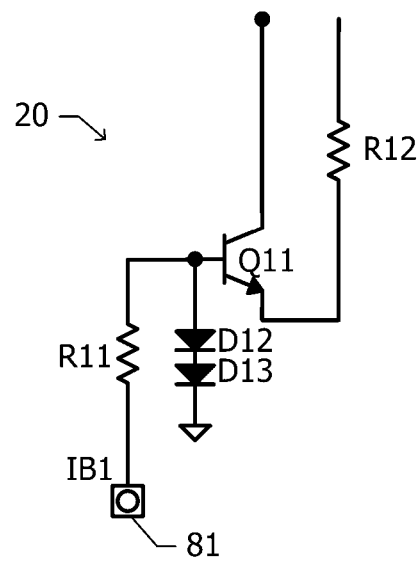
FIG. 5 is an equivalent circuit diagram of an emitter-follower-type first bias circuit in a power amplifier module according to a modification of the first exemplary embodiment.

FIG. 5 is an equivalent circuit diagram of the emitter-follower-type first bias circuit 20 in the power amplifier module 50 according to the modification of the first exemplary embodiment. In this modification, the emitter-follower-type first bias circuit 20 includes diodes D12 and D13 in place of the transistors Q12 and Q13 in the first bias circuit 20 (FIG. 1) of the power amplifier module 50 according to the first exemplary embodiment. In this modification, a voltage corresponding to the amount of voltage drop generated across the two diodes D12 and D13, which are connected in series, is applied to the base of the first bias supply transistor Q11.

Also, in this modification, a base voltage of a predetermined level can be supplied to the base of the first bias supply transistor Q11 in accordance with the bias control signal IB1.

Next, other modifications of the first exemplary embodiment will be described with reference to FIGS. 6A to 7C. The second bias circuit 30 in the power amplifier module 50 according to the first exemplary embodiment, which is used for APT, is not limited to the circuit configuration illustrated in FIG. 1. In the following modifications, the circuit configuration of the second bias circuit 30 is different from the circuit configuration of the second bias circuit 30 of the power amplifier module 50 according to the first exemplary embodiment. The second bias circuit 30 may be a bias circuit including a current path along which a portion of the emitter current output from the second bias supply transistor Q21 is returned to the second bias circuit 30 such that negative feedback control is performed on the emitter current of the second bias supply transistor Q21. The second bias circuit 30 can be a bias circuit designed such that no gain expansion can be achieved.

FIGS. 6A to 7B are equivalent circuit diagrams of the feedback-type second bias circuit 30 in the power amplifier module 50 according to modifications of the first exemplary embodiment. The following describes the differences from the second bias circuit 30 of the power amplifier module 50 according to the first exemplary embodiment.

Figure 6A:
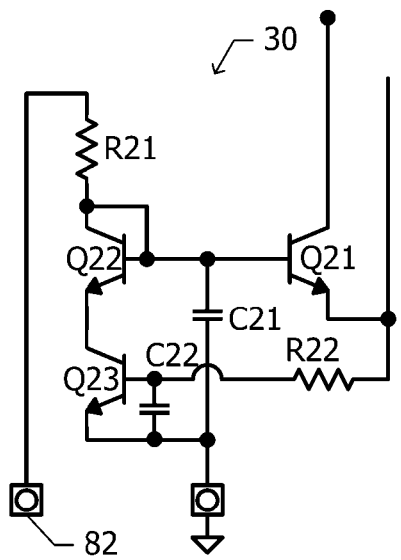
FIGS. 6A, 6B, and 6C are equivalent circuit diagrams of a feedback-type second bias circuit in a power amplifier module according to other modifications of the first exemplary embodiment.

In the modification illustrated in FIG. 6A, the capacitor C22 is connected between the base of the transistor Q23 and ground. In this configuration, an RF signal flowing from the power-stage amplifier circuit 10 is connected to ground for AC without necessarily the intervention of the transistor Q23.

Figure 6B:
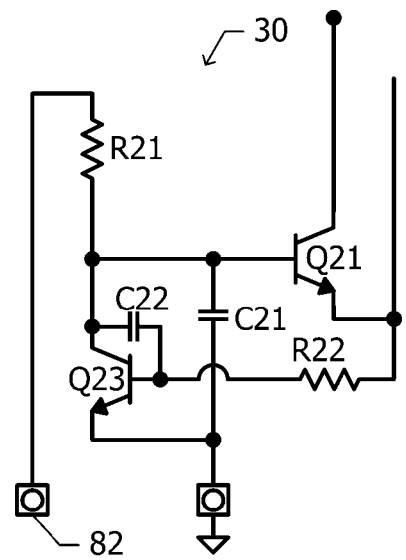

In the modification illustrated in FIG. 6B, the transistor Q22 (FIG. 1) is removed, and the collector of the transistor Q23 is connected directly to the resistor R21. The collector of the transistor Q23 is connected to the base of the second bias supply transistor Q21. In this configuration, a voltage corresponding to the amount of voltage drop across the transistor Q23 is applied to the base of the second bias supply transistor Q21.

Figure 6C:
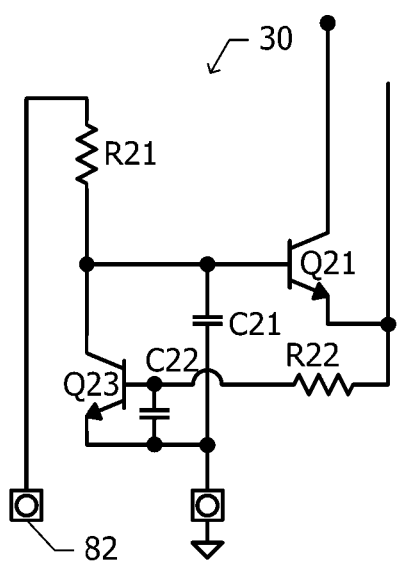

In the modification illustrated in FIG. 6C, as in the modification illustrated in FIG. 6A, the capacitor C22 is connected between the base of the transistor Q23 and ground. Also, as in the modification illustrated in FIG. 6B, the transistor Q22 (FIG. 1) is removed.

Figure 7A:
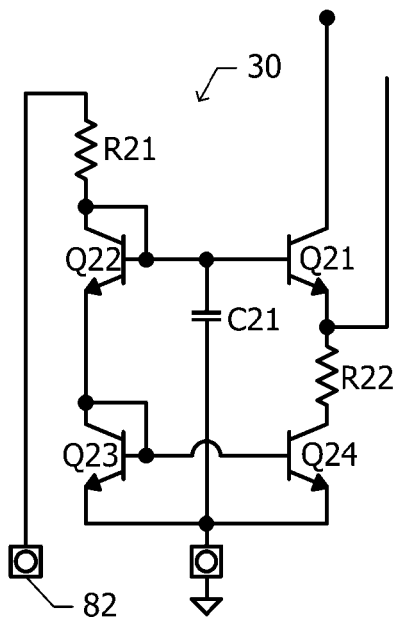
FIGS. 7A, 7B, and 7C are equivalent circuit diagrams of a feedback-type second bias circuit in a power amplifier module according to other modifications of the first exemplary embodiment.

In the modification illustrated in FIG. 7A, the emitter of the second bias supply transistor Q21 is grounded via the resistor R22 and a transistor Q24. The transistor Q23 is diode-connected, and the base of the transistor Q24 is connected to the base of the transistor Q23. The transistor Q23 and the transistor Q24 constitute a current mirror.

Also, in this modification, like the second bias circuit 30 (FIG. 1) in the power amplifier module 50 according to the first exemplary embodiment, the increase in the bias current caused by the self-bias when the output power increases is suppressed by the negative feedback control of the second bias circuit 30. Consequently, advantageously, gain expansion is less likely to occur.

Figure 7B:
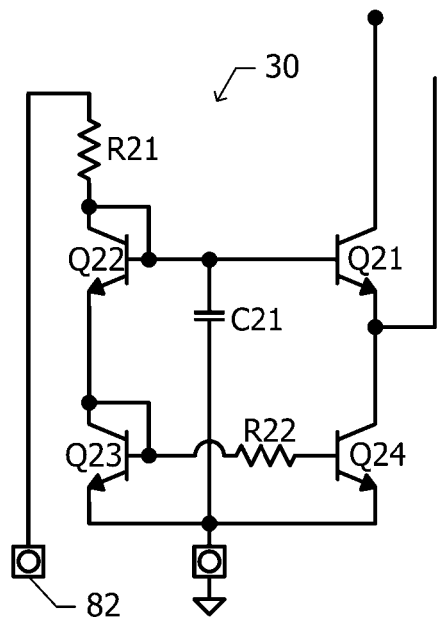

In the modification illustrated in FIG. 7B, the resistor R22 of the second bias circuit 30 is connected at a different location from that in the modification illustrated in FIG. 7A. In this modification, the resistor R22 is connected between the base of the transistor Q24 and the base of the transistor Q23. Also, in this modification, as in the modification illustrated in FIG. 7A, advantageously, gain expansion is less likely to occur when the output power increases.

Figure 7C:
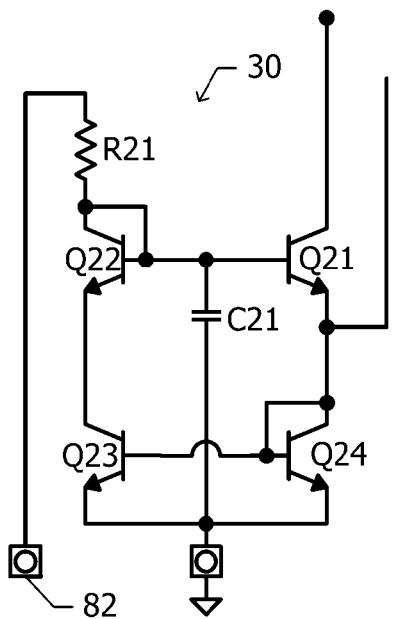

In the modification illustrated in FIG. 7C, the emitter of the second bias supply transistor Q21 is grounded via a diode-connected transistor Q24. The base of the transistor Q24 and the base of the transistor Q23 are connected, and the transistor Q24 and the transistor Q23 form a current mirror.

Also, in this modification, as in the modification illustrated in FIG. 7A, advantageously, gain expansion is less likely to occur when the output power increases.

Next, still another modification of the first exemplary embodiment will be described.

In the first exemplary embodiment, the first bias circuit 20 (FIG. 1) and the second bias circuit 30 (FIG. 1) are each implemented as a heterojunction bipolar transistor. Alternatively, each of the first bias circuit 20 (FIG. 1) and the second bias circuit 30 (FIG. 1) may be implemented as a homojunction bipolar transistor, a junction field-effect transistor, a metal-insulator-semiconductor (MIS) field-effect transistor, a metal-semiconductor (MES) field-effect transistor, or the like.

In the first exemplary embodiment, furthermore, the external terminal 81 of the first bias circuit 20 (FIG. 1) and the external terminal 82 of the second bias circuit 30 (FIG. 1) are each connected to a variable current source. Alternatively, the external terminal 81 of the first bias circuit 20 (FIG. 1) and the external terminal 82 of the second bias circuit 30 (FIG. 1) may be each connected to a variable voltage source.

In the first exemplary embodiment, furthermore, the power-stage amplifier circuit 10 of the power amplifier module 50 is capable of operating in two operation modes. Alternatively, the power-stage amplifier circuit 10 may be capable of operating in three or more operation modes. The two operation modes include the first operation mode corresponding to the ET scheme and the second operation mode corresponding to the APT scheme. Alternatively, at least two operation modes with different relationships between the gain and output level of the power-stage amplifier circuit 10 may be used. For example, an operation mode based on a fixed voltage scheme or an operation mode based on a variable voltage scheme may be used.

Second Exemplary Embodiment

Next, a power amplifier module 50 according to a second exemplary embodiment will be described with reference to FIG. 8. In the following, the configuration common to the power amplifier module 50 according to the first exemplary embodiment (FIGS. 1 and 2) will not be described.

Figure 8:
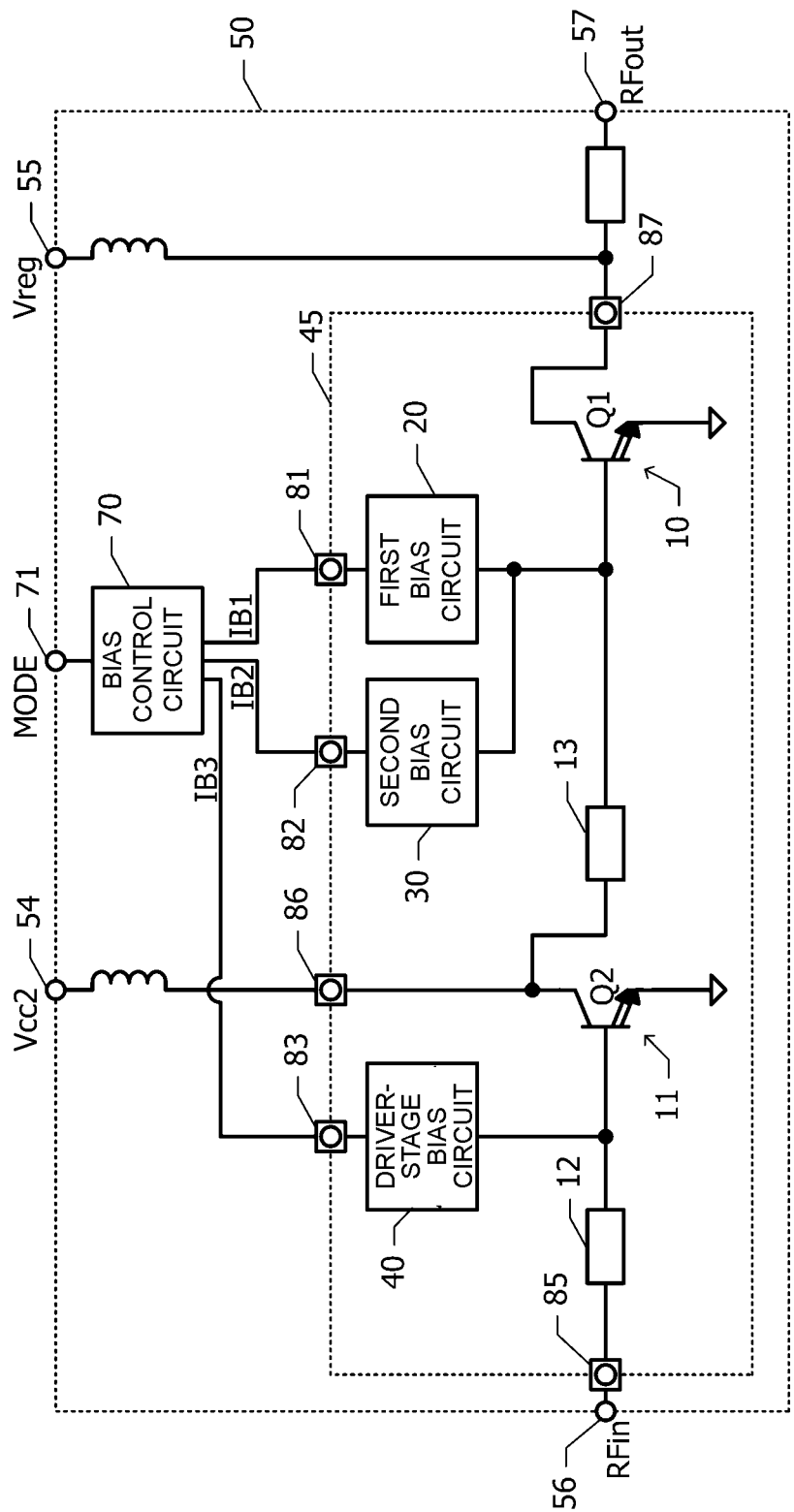
FIG. 8 is a block diagram of a power amplifier module according to a second exemplary embodiment.

FIG. 8 is a block diagram of the power amplifier module 50 according to the second exemplary embodiment. In the first exemplary embodiment (FIG. 2), the bias control circuit 70 is connected to the bias control terminals 51, 52, and 53 of the power amplifier module 50. In the second exemplary embodiment, the bias control circuit 70 is mounted on the same module substrate as that on which the amplifier circuit element 45 is mounted, and is included in the power amplifier module 50. In this case, the external terminals 81, 82, and 83 of the amplifier circuit element 45 may be regarded as bias control terminals. The operation mode notification terminal 71 is included in the external terminals of the power amplifier module 50.

Next, advantages of the second exemplary embodiment will be described.

The second exemplary embodiment also achieves advantages similar to those in the first exemplary embodiment. Specifically, when the power-stage amplifier circuit 10 (FIG. 1) is caused to operate in the first operation mode corresponding to the ET scheme, the gain at the peak point PP (FIG. 4A) is easily determined. As a result, advantageously, the compression point CP (FIG. 4A) is stabilized. When the power-stage amplifier circuit 10 (FIG. 1) is caused to operate in the second operation mode corresponding to the APT scheme, the deterioration of the EVM can be suppressed.

Third Exemplary Embodiment

Next, a power amplifier module according to a third exemplary embodiment will be described with reference to FIGS. 9, 10A, and 10B. In the following, the configuration common to the power amplifier module according to the first exemplary embodiment (FIGS. 1, 2, and 3) will not be described.

In the first exemplary embodiment, the two operation modes of the power-stage amplifier circuit 10 (FIGS. 1 and 2) include the first operation mode corresponding to the ET scheme and the second operation mode corresponding to the APT scheme. In the third exemplary embodiment, the first operation mode of the power-stage amplifier circuit 10 (FIGS. 1 and 2) is an operation mode in which an RF output signal has low power (hereinafter referred to as "low-power operation mode"), and the second operation mode of the power-stage amplifier circuit 10 (FIGS. 1 and 2) is an operation mode in which an RF output signal has relatively high (hereinafter referred to as "high-power operation mode"). The low-power operation mode and the high-power operation mode have different relationships between the gain and output level of the power-stage amplifier circuit 10. The relationship between the gain and output level of the power-stage amplifier circuit 10 in the high-power operation mode is different from the relationship between the gain and output level of the power-stage amplifier circuit 10 in the low-power operation mode such that in the high-power operation mode, a high gain is maintained at a higher output level than in the low-power operation mode.

Figure 9:
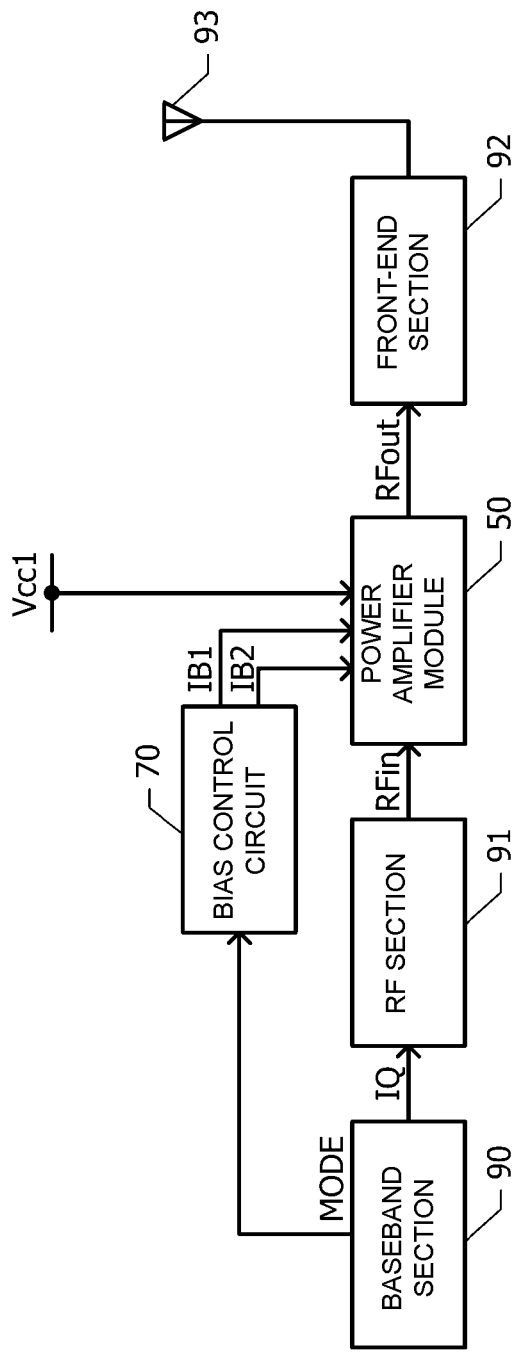
FIG. 9 is a block diagram of a transmission module including a power amplifier module according to a third exemplary embodiment.

FIG. 9 is block diagram of a transmission module including the power amplifier module 50 according to the third exemplary embodiment. In the first exemplary embodiment, the power supply voltage Vreg is supplied from the power supply circuit 94 (FIG. 3) to the power-stage amplifier circuit 10 of the power amplifier module 50 (FIG. 1). The power supply voltage Vreg is switched between the first power supply voltage for the ET scheme and the second power supply voltage for the APT scheme in accordance with the operation mode of the power-stage amplifier circuit 10 (FIG. 1). In the third exemplary embodiment, the power supply voltage Vcc1 for the APT scheme is supplied to the power-stage amplifier circuit 10 of the power amplifier module 50 (FIG. 1). That is, the power-stage amplifier circuit 10 of the power amplifier module 50 operates in accordance with the APT scheme.

The baseband section 90 outputs the operation mode notification signal MODE to the bias control circuit 70 in accordance with the signal level (the magnitude of the power) of the RF output signal RFout. For example, when the RF output signal RFout has a level greater than or equal to a predetermined level, the baseband section 90 notifies the bias control circuit 70 of the high-power operation mode as the operation mode. When the RF output signal RFout has a level less than the predetermined level, the baseband section 90 notifies the bias control circuit 70 of the low-power operation mode as the operation mode.

The bias control circuit 70 supplies at least one of the bias control signals IB1 and IB2 to the power amplifier module 50 in accordance with the operation mode indicated by the operation mode notification signal MODE. In this exemplary embodiment, in response to being notified of the low-power operation mode as the operation mode, the bias control circuit 70 supplies the bias control signal IB1 and does not supply the bias control signal IB2. Accordingly, the first bias circuit 20 (FIG. 1) operates, whereas the second bias circuit 30 (FIG. 1) does not operate. In response to being notified of the high-power operation mode as the operation mode, the bias control circuit 70 supplies both the bias control signals IB1 and IB2. Accordingly, both the first bias circuit 20 (FIG. 1) and the second bias circuit 30 (FIG. 1) operate.

Next, advantages of the third exemplary embodiment will be described with reference to FIGS. 10A and 10B.

Figure 10A:
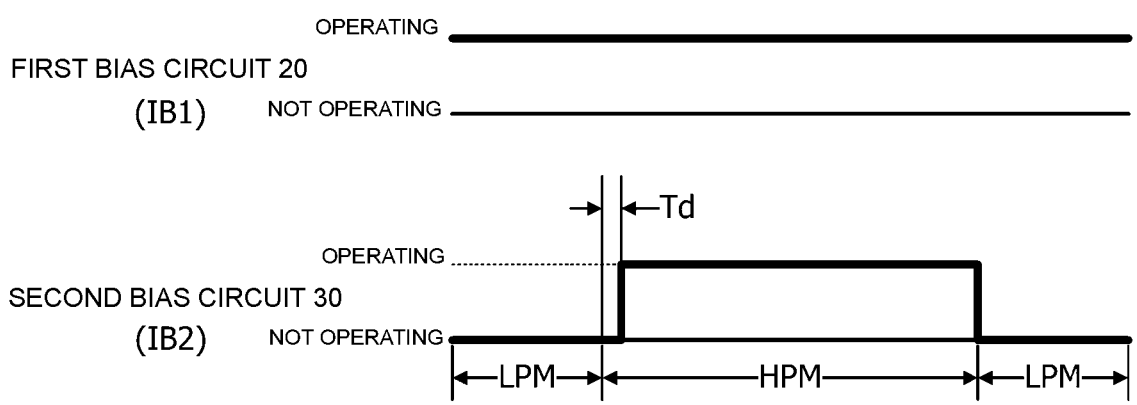
FIG. 10A is a timing chart illustrating the operating state of a first bias circuit and a second bias circuit in the power amplifier module according to the third exemplary embodiment.

FIG. 10A is a timing chart illustrating the operating state of the first bias circuit 20 (FIG. 1) and the second bias circuit 30 (FIG. 1) in the power amplifier module 50 according to the third exemplary embodiment. FIG. 10A illustrates an example in which a low-power operation mode LPM is switched to a high-power operation mode HPM and then the high-power operation mode HPM is switched to the low-power operation mode LPM.

The first bias circuit 20 constantly operates, regardless of the operation mode. The second bias circuit 30 operates only during a period corresponding to the high-power operation mode HPM. A delay time Td occurs between the start of supply of the bias control signal IB2 and the start of the operation of the second bias circuit 30. During the delay time Td, a bias current is supplied to the power-stage amplifier circuit 10 only from the first bias circuit 20.

Figure 10B:
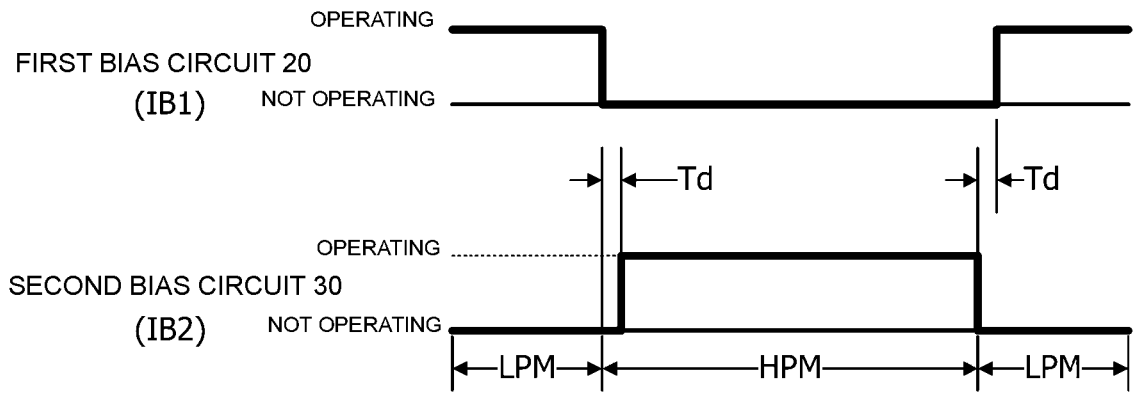
FIG. 10B is a timing chart illustrating the operating state of a first bias circuit and a second bias circuit in a power amplifier module in a comparative example.

FIG. 10B is a timing chart illustrating the operating state of the first bias circuit 20 and the second bias circuit 30 in a power amplifier module in a comparative example. In the comparative example, the bias control circuit 70 (FIG. 9) supplies the bias control signal IB1 only to the first bias circuit 20 during a period corresponding to the low-power operation mode LPM, and supplies the bias control signal IB2 only to the second bias circuit 30 during a period corresponding to the high-power operation mode HPM.

When the operation mode is switched from the low-power operation mode LPM to the high-power operation mode HPM, the operation of the first bias circuit 20 is stopped substantially instantaneously. A delay time Td occurs until the operation of the second bias circuit 30 is started. Accordingly, there is a time period during which the first bias circuit 20 and the second bias circuit 30 are not in operation. Also, when the operation mode is switched from the high-power operation mode HPM to the low-power operation mode LPM, there is a time period during which the first bias circuit 20 and the second bias circuit 30 are not in operation.

In the period during which the first bias circuit 20 and the second bias circuit 30 are not in operation, the power amplifier module 50 does not perform amplification, and thus the RF output signal RFout is not output. That is, instantaneous interruption of a transmission signal occurs.

In the third exemplary embodiment, in contrast, the first bias circuit 20 constantly operates. Thus, instantaneous interruption of a transmission signal can be prevented.

In particular, when the feedback-type second bias circuit 30 is in use during operation at low temperatures, at the time when the power-stage amplifier circuit 10 (FIG. 1) starts an amplification operation in response to the rise edge of the waveform of the RF input signal RFin, feedback control becomes unstable, and the EVM is likely to deteriorate. In the third exemplary embodiment, the emitter-follower-type first bias circuit 20 is caused to operate in the low-power operation mode. This can suppress the deterioration of the EVM at the rise time of the waveform of the RF input signal RFin. In the low-power operation mode, furthermore, there is substantially no influence of the self-bias. Thus, no gain expansion occurs, resulting in high linearity of AM-AM being maintained.

When the operation mode is the high-power operation mode, the feedback-type second bias circuit 30 also operates in addition to the first bias circuit 20. Thus, gain expansion caused by an increase in the power of the RF output signal RFout is suppressed, resulting in high linearity of AM-AM being maintained.

In the first exemplary embodiment, the output resistor R12 of the first bias circuit 20 (FIG. 1) may be removed. In contrast, as in the third exemplary embodiment, when there is a period during which both the first bias circuit 20 and the second bias circuit 30 are caused to operate simultaneously, the output resistor R12 can be connected between the first bias supply transistor Q11 and the base ballast resistor R1.

Next, a modification of the third exemplary embodiment will be described.

In the third exemplary embodiment, the emitter-follower-type first bias circuit 20 is caused to operate constantly, regardless of the operation mode. Alternatively, the operation of the first bias circuit 20 may be stopped in the high-power operation mode on the condition that no instantaneous interruption occurs at the time of switching between operation modes. For example, the operation of the first bias circuit 20 may be stopped at a point in time when a longer time than the delay time Td (FIGS. 10A and 10B) elapses from the point in time when the low-power operation mode is switched to the high-power operation mode.

It is to be understood that the exemplary embodiments described above are illustrative and that configurations provided in different embodiments may be partially replaced or combined. Similar operational effects achieved with similar configurations in a plurality of embodiments are not described in the individual embodiments. In addition, the present disclosure is not limited to the exemplary embodiments described above. It will be apparent to a person skilled in the art that, for example, various changes, improvements, combinations, and so on may be made.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier module comprising:
   an amplifier transistor configured to amplify an input signal and to output an amplified signal, and configured to operate in at least two operation modes having different characteristics;
   a first bias circuit comprising a first bias supply transistor and a first bias control terminal configured to receive a first bias control signal, the first bias circuit being configured to supply an output current of the first bias supply transistor to the amplifier transistor as a bias current;
   a second bias circuit comprising a second bias supply transistor, a second bias control terminal configured to receive a second bias control signal, and a current path, the second bias circuit being configured to supply a first portion of an output current of the second bias supply transistor to the amplifier transistor as the bias current and to return a second portion of the output current via the current path;
   the first bias circuit being configured to be selected and operated in accordance with the operation mode of the amplifier transistor based on the first bias control signal; and
   the second bias circuit being configured to be selected and operated in accordance with the operation mode of the amplifier transistor based on the second bias control signal.

2. The power amplifier module according to claim 1, wherein the at least two operation modes have different relationships between a gain and an output level.

3. The power amplifier module according to claim 1, wherein the second bias circuit is configured to decrease the output current of the second bias supply transistor in response to an increase in current flowing through the current path.

4. The power amplifier module according to claim 2, wherein the second bias circuit is configured to decrease the output current of the second bias supply transistor in response to an increase in current flowing through the current path.

5. The power amplifier module according to claim 1, wherein:
   when the amplifier transistor operates in a first operation mode, a first power supply voltage is supplied to the amplifier transistor,
   when the amplifier transistor operates in a second operation mode, a second power supply voltage is supplied to the amplifier transistor, the second power supply voltage being different than the first power supply voltage, and
   the power amplifier module further comprises:
      an operation mode notification terminal configured to receive a notification of an operation mode of the amplifier transistor; and
      a bias control circuit configured to render the first bias circuit operative in response to receipt of a notification at the operation mode notification terminal that the amplifier transistor is operating in the first operation mode, and configured to render the second bias circuit operative in response to receipt of a notification at the operation mode notification terminal that the amplifier transistor is operating in the second operation mode.

6. The power amplifier module according to claim 2, wherein:
   when the amplifier transistor operates in a first operation mode, a first power supply voltage is supplied to the amplifier transistor,
   when the amplifier transistor operates in a second operation mode, a second power supply voltage is supplied to the amplifier transistor, the second power supply voltage being different than the first power supply voltage, and
   the power amplifier module further comprises:
      an operation mode notification terminal configured to receive a notification of an operation mode of the amplifier transistor; and
      a bias control circuit configured to render the first bias circuit operative in response to receipt of a notification at the operation mode notification terminal that the amplifier transistor is operating in the first operation mode, and configured to render the second bias circuit operative in response to receipt of a notification at the operation mode notification terminal that the amplifier transistor is operating in the second operation mode.

7. The power amplifier module according to claim 3, wherein:
   when the amplifier transistor operates in a first operation mode, a first power supply voltage is supplied to the amplifier transistor,
   when the amplifier transistor operates in a second operation mode, a second power supply voltage is supplied to the amplifier transistor, the second power supply voltage being different than the first power supply voltage, and
   the power amplifier module further comprises:
      an operation mode notification terminal configured to receive a notification of an operation mode of the amplifier transistor; and
      a bias control circuit configured to render the first bias circuit operative in response to receipt of a notification at the operation mode notification terminal that the amplifier transistor is operating in the first operation mode, and configured to render the second bias circuit operative in response to receipt of a notification at the operation mode notification terminal that the amplifier transistor is operating in the second operation mode.

8. The power amplifier module according to claim 4, wherein:
when the amplifier transistor operates in a first operation mode, a first power supply voltage is supplied to the amplifier transistor,
when the amplifier transistor operates in a second operation mode, a second power supply voltage is supplied to the amplifier transistor, the second power supply voltage being different than the first power supply voltage, and
the power amplifier module further comprises:
an operation mode notification terminal configured to receive a notification of an operation mode of the amplifier transistor; and
a bias control circuit configured to render the first bias circuit operative in response to receipt of a notification at the operation mode notification terminal that the amplifier transistor is operating in the first operation mode, and configured to render the second bias circuit operative in response to receipt of a notification at the operation mode notification terminal that the amplifier transistor is operating in the second operation mode.

9. The power amplifier module according to claim 5, wherein:
the first power supply voltage is a power supply voltage that causes the amplifier transistor to operate in accordance with an envelope tracking scheme, and
the second power supply voltage is a power supply voltage that causes the amplifier transistor to operate in accordance with an average power tracking scheme.

10. The power amplifier module according to claim 1, further comprising:
an operation mode notification terminal configured to receive a notification of an operation mode of the amplifier transistor; and
a bias control circuit configured to render the first bias circuit operative in response to receipt of a notification at the operation mode notification terminal that the amplifier transistor is operating in a first operation mode, and configured to render both the first bias circuit and the second bias circuit operative in response to receipt of a notification at the operation mode notification terminal that the amplifier transistor is operating in a second operation mode.

11. The power amplifier module according to claim 2, further comprising:
an operation mode notification terminal configured to receive a notification of an operation mode of the amplifier transistor; and
a bias control circuit configured to render the first bias circuit operative in response to receipt of a notification at the operation mode notification terminal that the amplifier transistor is operating in a first operation mode, and configured to render both the first bias circuit and the second bias circuit operative in response to receipt of a notification at the operation mode notification terminal that the amplifier transistor is operating in a second operation mode.

12. The power amplifier module according to claim 3, further comprising:
an operation mode notification terminal configured to receive a notification of an operation mode of the amplifier transistor; and
a bias control circuit configured to render the first bias circuit operative in response to receipt of a notification at the operation mode notification terminal that the amplifier transistor is operating in a first operation mode, and configured to render both the first bias circuit and the second bias circuit operative in response to receipt of a notification at the operation mode notification terminal that the amplifier transistor is operating in a second operation mode.

13. The power amplifier module according to claim 4, further comprising:
an operation mode notification terminal configured to receive a notification of an operation mode of the amplifier transistor; and
a bias control circuit configured to render the first bias circuit operative in response to receipt of a notification at the operation mode notification terminal that the amplifier transistor is operating in a first operation mode, and configured to render both the first bias circuit and the second bias circuit operative in response to receipt of a notification at the operation mode notification terminal that the amplifier transistor is operating in a second operation mode.

14. The power amplifier module according to claim 10, wherein when the amplifier transistor operates in the second operation mode, a high gain is maintained at a higher output level than when the amplifier transistor operates in the first operation mode.

15. The power amplifier module according to claim 11, wherein when the amplifier transistor operates in the second operation mode, a high gain is maintained at a higher output level than when the amplifier transistor operates in the first operation mode.

16. The power amplifier module according to claim 12, wherein when the amplifier transistor operates in the second operation mode, a high gain is maintained at a higher output level than when the amplifier transistor operates in the first operation mode.

17. The power amplifier module according to claim 13, wherein when the amplifier transistor operates in the second operation mode, a high gain is maintained at a higher output level than when the amplifier transistor operates in the first operation mode.

18. A power amplification method for operating a power amplifier module to perform power amplification, the power amplifier module comprising an amplifier transistor that amplifies an input signal and outputs the amplified signal, a first bias circuit that comprises a first bias supply transistor and that supplies an output current of the first bias supply transistor to the amplifier transistor as a bias current, and a second bias circuit that comprises a second bias supply transistor and that supplies a portion of an output current of the second bias supply transistor to the amplifier transistor as the bias current, the second bias circuit further comprising a current path along which a portion of the output current of the second bias supply transistor is returned to the second bias circuit, the power amplification method comprising:
supplying the bias current from the first bias circuit to the amplifier transistor when the amplifier transistor is caused to operate in accordance with an envelope tracking scheme; and supplying the bias current from the second bias circuit to the amplifier transistor when the amplifier transistor is caused to operate in accordance with an average power tracking scheme.

19. A power amplification method for operating a power amplifier module to perform power amplification, the power amplifier module comprising an amplifier transistor that amplifies an input signal and outputs the amplified signal, a first bias circuit that comprises a first bias supply transistor and that supplies an output current of the first bias supply transistor to the amplifier transistor as a bias current, and a second bias circuit that comprises a second bias supply transistor and that supplies a portion of an output current of the second bias supply transistor to the amplifier transistor as the bias current, the second bias circuit further comprising a current path along which a portion of the output current of the second bias supply transistor is returned to the second bias circuit, the power amplification method comprising:

switching between supplying the bias current from the first bias circuit to the amplifier transistor and supplying the bias current from both the first bias circuit and the second bias circuit to the amplifier transistor, in accordance with a signal level output from the amplifier transistor.

20. The power amplifier module according to claim 1, further comprising:

a bias control circuit configured to render the first bias circuit operative when the amplifier transistor is operating in the first operation mode and configured to render the second bias circuit operative when the amplifier transistor is operating in the second operation mode.

\* \* \* \* \*

UNITED STATES PATENT AND TRADEMARK OFFICE
CERTIFICATE OF CORRECTION

PATENT NO. : 11,431,305 B2
APPLICATION NO. : 17/081168
DATED : August 30, 2022
INVENTOR(S) : Yoshiaki Sukemori It is certified that error appears in the above-identified patent and that said Letters Patent is hereby corrected as shown below:

In the Specification

Column 8, Line 45, "CTRL" should be -- CTR1 --.

Signed and Sealed this
Twenty-fourth Day of October, 2023

Katherine Kelly Vidal
*Director of the United States Patent and Trademark Office*